United States Patent [19]
Ichikawa

[11] Patent Number: 5,986,503
[45] Date of Patent: Nov. 16, 1999

[54] POWER AMPLIFIER WITH AN IDLE CURRENT TRIMMED AND A METHOD OF TRIMMING THE POWER AMPLIFIER

[75] Inventor: Yohei Ichikawa, Yokohama, Japan

[73] Assignee: Matsushita Electric Industrial Co., Ltd., Osaka, Japan

[21] Appl. No.: 09/066,778

[22] Filed: Apr. 27, 1998

[30] Foreign Application Priority Data

May 16, 1997 [JP] Japan ................................ 9-127225

[51] Int. Cl.⁶ ........................... H03F 3/16; H03F 3/04
[52] U.S. Cl. ...................................... 330/277; 330/296
[58] Field of Search ................................. 330/296, 277, 330/310, 66

[56] References Cited

U.S. PATENT DOCUMENTS

| | | | |
|---|---|---|---|
| 5,060,294 | 10/1991 | Schwent et al. | 330/51 |
| 5,250,912 | 10/1993 | Fujita | 330/285 |
| 5,675,290 | 10/1997 | Tsukahara et al. | 330/277 |
| 5,745,857 | 4/1998 | Maeng et al. | 330/310 |

FOREIGN PATENT DOCUMENTS

| | | |
|---|---|---|
| 697748 | 4/1994 | Japan . |
| 8125465 | 5/1996 | Japan . |

*Primary Examiner*—Robert Pascal
*Assistant Examiner*—Patricia Nguyen
*Attorney, Agent, or Firm*—Pollock, Vande Sande & Amernick

[57] ABSTRACT

A power amplifier including an FET and a gate bias circuit having a variable resistor (VR) and a method of trimming the VR in the power amplifier are disclosed. The VR is trimmed to make the bias voltage to a pinch-off voltage of the FET. A first current in the pinch-off voltage condition from a bias supply voltage is measured. The VR is adjusted with a second current from the bias supply voltage measured. A difference between the first and second drain current values is calculated and a resistance of the VR is determined to make the difference within a reference. A second VR may be connected to the VR in parallel to make trimming the bias voltage easier or more accurately. The second VR may comprise a printed circuit pattern which shows 0Ω for the pinch-off condition and the printed circuit pattern also provides the infinite resistance when it is cut to adjust the VR. Another power amplifier including a memory and a D/A converter for generating the gate bias voltage is also disclosed. The memory stores data making the FET in the pinch-off condition to measure the first current, a set of data varying the second current to adjust the VR and can store the data making the difference within the predetermined value. In the case of multi-stage, trimming is performed from one of stages of which reference is smallest.

10 Claims, 9 Drawing Sheets

POWER AMPLIFIER WITH AN IDLE CURRENT TRIMMED AND A METHOD OF TRIMMING THE POWER AMPLIFIER

BACKGROUND OF THE INVENTION

1. Field of the Invention

This invention relates to a power amplifier with an idle current trimmed and a method of trimming the power amplifier.

2. Description of the Prior Art

A power amplifier for amplifying a signal with an idle current flowing through a field effect transistor trimmed and a method of trimming the idle current are known.

Such a prior art amplifier and method are disclosed in Japanese patent application provisional publication No. 8-125465. FIG. 8 is a circuit diagram of this prior art power amplifier. A variable resistor 44 is provided in the gate bias circuit 40 to adjust an idle current of an FET 30 to make the idle current even to eliminate a dispersion in the output power. This Japanese patent application also discloses a gate bias voltage generation circuit using a D/A converter. FIG. 9 is a block diagram of another prior art power amplifier including this gate bias voltage generation circuit. A D/A converter 70 supplies a gate bias voltage controlled in accordance with data in an EEPROM 60 under control of a CPU 50 using a negative supply voltage −V from a −V regulator 80.

SUMMARY OF THE INVENTION

The aim of the present invention is to provide an superior power amplifier and a superior method of trimming the power amplifier.

According to the present invention, a first power amplifier is provided, which includes: an input circuit for receiving a signal; a bias voltage generation circuit, including a variable resistor, for generating a bias voltage; a field effect transistor, having a gate supplied with the received signal and the bias voltage, a source, and a drain, for amplifying the received signal; a source and drain circuit, coupled to the field effect transistor, for flowing a current through the source and the drain; and an outputting circuit for outputting the amplified signal from the filed effect transistor, wherein the bias voltage generation circuit generates the bias voltage within a voltage range including a first voltage making the field effect transistor in a pinch-off condition and a second voltage making the field effect transistor in a non-pinch-off condition.

In the first power amplifier, the bias voltage generation circuit includes a second variable resistor connected to the variable resistor in parallel, a resistance of the second variable resistor having a resistance range including a resistance making the field effect transistor in the pinch-off condition.

In this case, the first power amplifier may further include a printed circuit board, wherein the second variable resistor comprises a printed circuit pattern on the printed circuit board and the printed circuit pattern is provided to provide the pinch-off condition and the printed circuit patter is to be cut to provide the non-pinch-off condition.

According to the present invention, a second power amplifier is provided, which includes: an input circuit for receiving a signal; a bias voltage generation circuit including a storing and reading circuit responsive to a mode signal indicative of first to fourth mode and a storing command signal and voltage generation circuit, the storing and reading circuit storing a pinch-off voltage data, storing successively varying data set, for storing one data of the successively varying data set in response to the storing command signal in the first mode, and for reading the pinch-off voltage in the second mode, successively reading the successively varying data set in the third mode, and one data of the successively varying data set stored in response to the store command signal in the fourth mode, the voltage generation circuit generating a bias voltage in accordance with an output of the storing and reading circuit; a field effect transistor, having a gate supplied with the received signal and the bias voltage, a source, and a drain, for amplifying the received signal in the fourth mode; a source and drain circuit, coupled to the field effect transistor, for flowing a current through the source and the drain; and an outputting circuit for outputting the amplified signal from the field effect transistor, the pinch-off voltage making the field effect transistor in a pinch-off condition.

According to the present invention, a third power amplifier is provided, which includes: an input circuit for receiving a signal; a bias voltage generation circuit including a storing and reading circuit responsive to a mode signal indicative of first to fourth mode and a storing command signal and voltage generation circuit, the storing and reading circuit storing a pinch-off voltage data, storing successively varying data set, for storing an address of one data of the successively varying data set in response to the storing command signal in the first mode, and for reading the pinch-off voltage in the second mode, successively reading the successively varying data set in the third mode, and one data of the successively varying data set using the address stored in response to the store command signal in the fourth mode, the voltage generation circuit generating a bias voltage in accordance with an output of the storing and reading circuit; a field effect transistor, having a gate supplied with the received signal and the bias voltage, a source, and a drain, for amplifying the received signal in the fourth mode; a source and drain circuit, coupled to the field effect transistor, for flowing a current through the source and the drain; and an outputting circuit for outputting the amplified signal from the field effect transistor, the pinch-off voltage making the field effect transistor in a pinch-off condition.

According to the present invention, a first method of trimming a power amplifier including a field effect transistor and a bias voltage supply is provided, which includes the steps of: (a) providing a variable resistor supplying a bias voltage to a gate of the field effect transistor from the bias voltage supply; (b) trimming the variable resistor to make the bias voltage a pinch-off voltage of the field effect transistor; (c) measuring a first current from the bias voltage supply in step (b); (d) adjusting the viable resistor; (e) measuring a second current from the bias voltage supply in step (d); (f) calculating a difference between the first and second currents; and (g) determining a resistance of the variable resistor to make the difference within a predetermined value to amplify an input signal and output the amplified signal.

According to the present invention, a second method of trimming a power amplifier including a field effect transistor and a bias voltage supply is provided, which includes the steps of: (a) providing a first variable resistor supplying a bias voltage to a gate of the field effect transistor from the bias voltage supply; (b) providing a second variable resistor connected to the variable resistor in parallel in a condition that the first and second variable resistors provide a pinch-off voltage to the field effect transistor; (c) measuring a first current from the bias voltage supply; (d) making a resistance of the second variable resistor considerably higher than a resistance of the first resistor; (e) measuring a second current from the bias voltage supply after step (d); (f) adjusting the first variable resistor; (g) calculating a difference between the first and second currents; and (h) determining the resistance of the first variable resistor to make the difference within a predetermined value to amplify an input signal and output the amplified signal.

In the second method, the second variable resistor is provided on a printed circuit board in step (b) and the second variable resistor is cut in step (d).

According to the present invention, a third method of trimming a power amplifier including a field effect transistor and a bias voltage supply is provided, which includes the steps of: (a) providing a memory and a d/a converter to the power amplifier circuit; (b) storing data for a pinch-off voltage and data set for successively varying gate bias voltage; (c) supplying the pinch-off voltage to a gate of the field effect transistor using the data from the memory, the d/a converter, and the bias voltage supply; (d) measuring a first current from the bias voltage supply; (e) supplying the bias voltage to the gate of the field effect transistor with the bias voltage successively varied using the successively varying gate bias voltage from the memory, the d/a converter, and the bias voltage supply; (f) measuring a second current from the bias voltage supply in step (e); (g) calculating a difference between the first and second currents; and (h) determining final data in accordance with the calculated difference to make the difference within a predetermined value; (i) storing the final data in the memory; and (j) supplying a final bias voltage to the gate of the field effect transistor in accordance with the stored final data to amplify an input signal and output the amplified signal.

According to the present invention, a fourth method of trimming a power amplifier including a field effect transistor and a bias voltage supply is provided, which includes the steps of: (a) providing variable resistors for supplying bias voltages to gates of the multi-stage field effect transistors from the bias voltage supply; (b) trimming the variable resistors to make the multi-stage field effect transistors in pinch-off conditions; (c) measuring a first current from the bias voltage supply in the pinch-off conditions; (d) adjusting one of the viable resistors of one of the multi-stage field effect transistors; (e) measuring a second current from the bias voltage supply in step (d); (f) calculating a difference between the first and second currents; and (g) determining a resistance of the variable resistor to make the difference within each of predetermined values, wherein the steps (d) to (h) are repeatedly performed to the other stages of the multi-stage of field effect transistors in order from the one of the multi-stage field effect transistors of which one of the predetermined values is smallest, the difference in step (f) being made between the second current presently measured in step (e) and the second current just previously measured in step (e) in the other stages of the multi-stage of field effect transistors.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

Detailed Description of the Invention
(First Embodiment)

Figure 1:
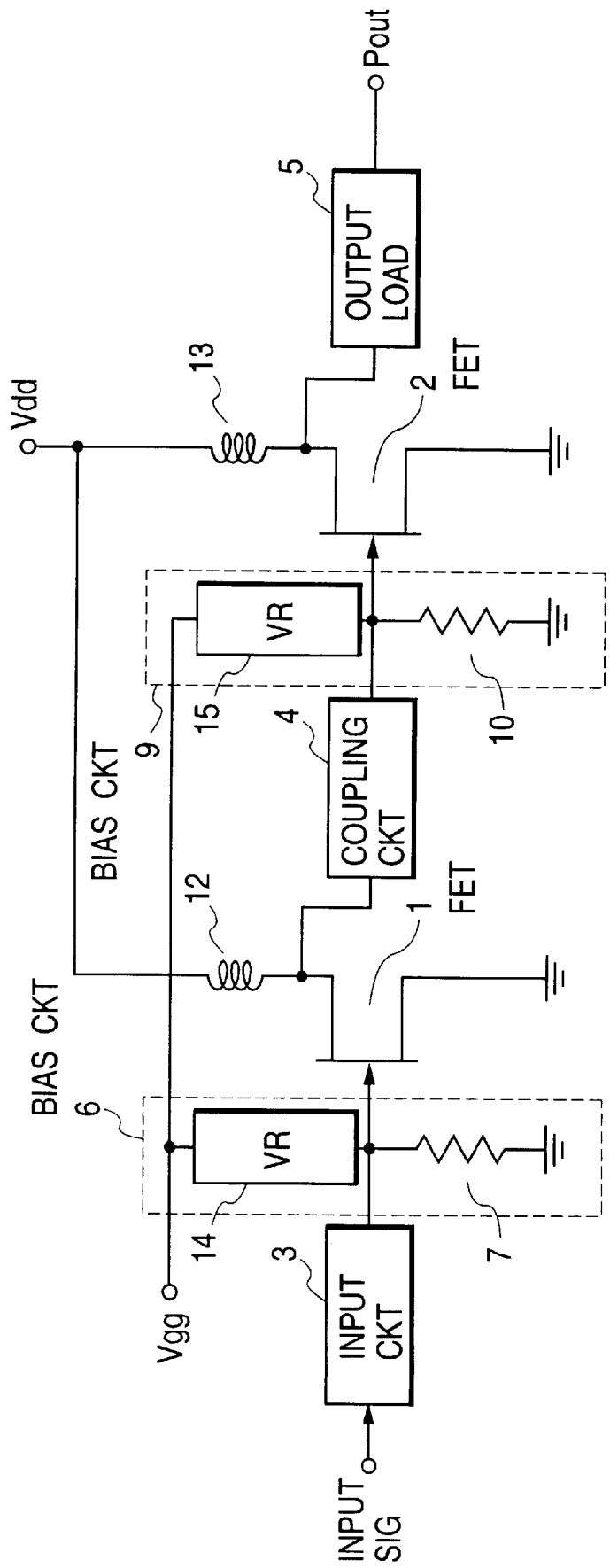
FIG. 1 is a circuit diagram of a power amplifier of a first embodiment.

FIG. 1 is a circuit diagram of a power amplifier of a first embodiment.

The power amplifier of the first embodiment includes first and second stages cascaded. The first stage includes an input circuit 3 for receiving an input signal, a resistor 7, a variable resistor 14, an FET (field effect transistor) 1, a choke coil 12, wherein the gate of the FET 1 is connected to the input circuit 3 and a Junction point of the variable resistor 14 and the resistor 7. The other end of the variable resistor 14 is supplied with a bias supply voltage Vgg and the other end of the resistor 7 is connected to the ground. The choke coil 12 supplies a supply voltage Vdd to the source (drain) of the FET 1 and the drain (source) of the FET 1 is connected to the ground. The second stage includes a coupling circuit 4 for receiving an output of the FET 1 from the source of the FET 1, a resistor 10, a variable resistor 15, an FET 2, a choke coil 13, and a output load 5, wherein the gate of the FET 2 is connected to the coupling circuit 4 and a Junction point of the variable resistor 15 and the resistor 10. The other end of the variable resistor 15 is supplied with the bias supply voltage Vgg and the other end of the resistor 10 is connected to the ground. The choke coil 13 supplies a supply voltage Vdd to the source (drain) of the FET 2 and the drain (source) of the FET 2 is connected to the ground. The output of the power amplifier is outputted from the source of the FET 2 through the output load 5.

In this circuit structure, it is assumed that Vdd=3.5 V, Vgg=−2.5 V, an idle current of the FET 1 is 120±5 mA, and an idle current of the FET 2 is 500±10 mA and there is a dispersion in the gate bias voltage (Vop) in the FETs 1 and 2, from −1.0 to −2.0 V and there is also a dispersion in the pinch-off voltage in the FETs 1 and 2 from Vp=−1.4 to −2.4 V.

In such a structure, to make the gate current Igg from the bias supply voltage Vgg lower than 1 mA, assuming resistances of the resistors 7 and 10 are 4 kΩ, resistances of the variable resistors 14 and 15 after trimming should be 2 to 8 kΩ. Moreover, the resistances of the resistors 14 and 15 before trimming should be lower than 160Ω to make the FETs 1 and 2 in pinch-off conditions for trimming. Accordingly the resistances of the resistor 14 and 15 are from 160Ω to 8 kΩ.

A method of trimming the variable resistor 14 and 15 will be described.

Figure 2:
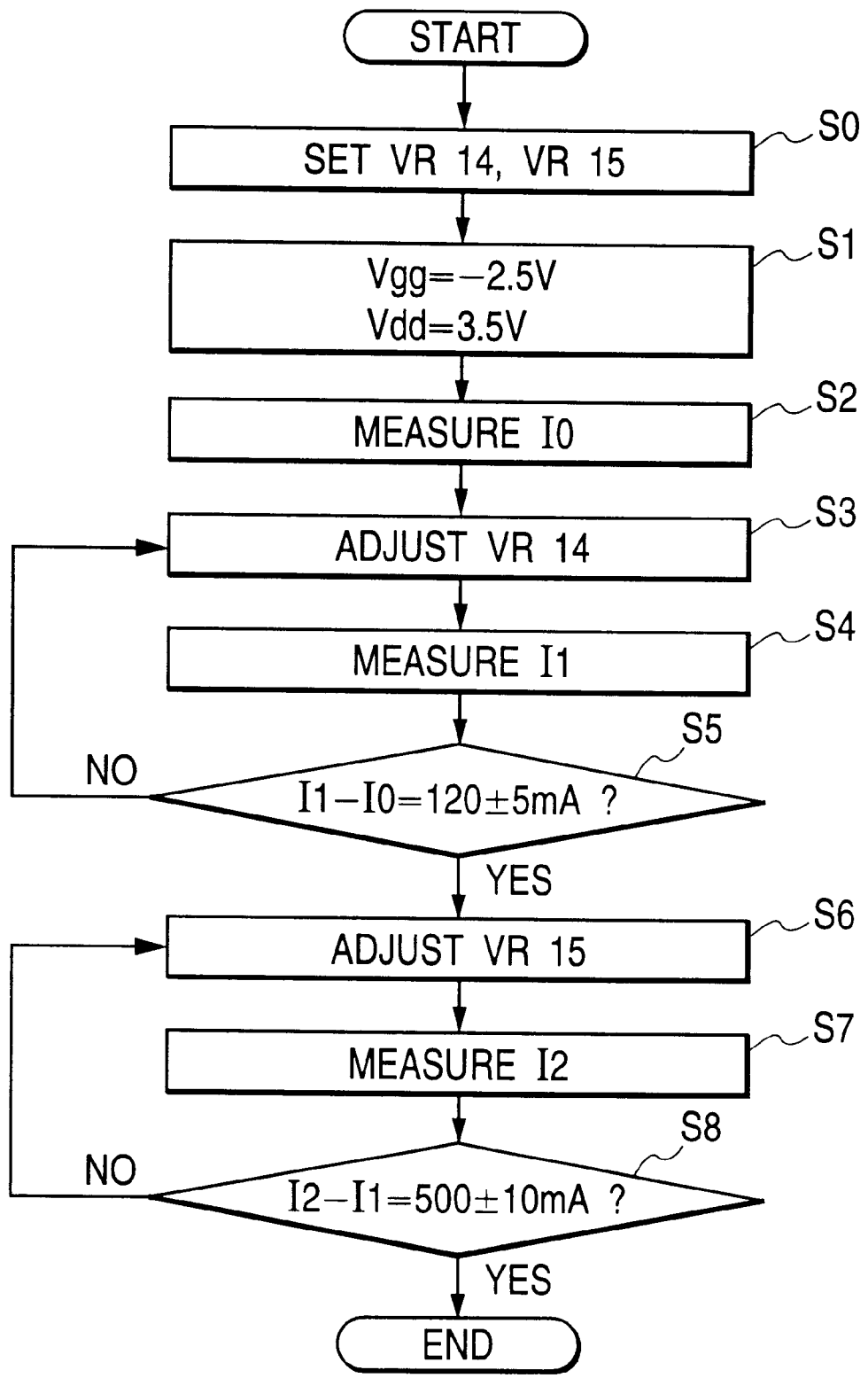
FIG. 2 shows a flow chart of the first embodiment showing trimming the variable resistors shown in FIG. 1.

FIG. 2 shows a flow chart of the first embodiment showing trimming the variable resistor 14 and 15 shown in FIG. 1.

In step s0, the variable resistors 14 and 15 are set to initial positions to provide resistances lower than 160Ω.

In step s1, the supply voltages Vgg=−2.5 V and Vdd=3.5V are applied to the power amplifier in this order. In the following step s2, an initial current I0 from the bias supply voltage Vdd is measured. In this condition the FETs 1 and 2 are in the pinch-off conditions, so that the initial current I0 is a total current other than drain currents in the FETs 1 and 2.

As the current I1 is measured, a resistance of the variable resistor 14 is varied (trimmed or adjusted) in steps s3 and s4. Then, the current I1 is a sum of the initial current I0 and the drain current of the FET 1 of the former stage. Then, the first difference I1−I0, that is, the drain current of the FET 1, is calculated and if the drain current of the FET 1 is within a first predetermined value, that is, 120±5 mA, trimming the variable resistor 14 has completed in step s5.

Moreover, as the current I2 from bias supply voltage Vdd after completion of trimming the variable resistor 14 is measured, the variable resistor 15 for the FET 2 in the rear stage is trimmed in steps s6 and s7. Then, a second difference I2−I1, that is, the drain current in the FET 2 is calculated and if the drain current in the FET 2 is within a second predetermined value, that is, 500±10 mA, trimming the variable resistor 15 has completed in step s8.

As mentioned, the FETs 1 and 2 are in the pinch-off conditions before trimming the variable resistors 14 and 15, so that the drain currents of respective FETs 1 and 2 can be obtained from the difference between the measured currents before and after trimming by trimming the FETs 1 and 2 in the order mentioned above. Moreover, because trimming the variable resistor is performed in the order that the predetermined value for the drain current is lower, so that heat generated in the FETs is suppressed, a temperature change is made lower to accurately adjust the variable resistors 14 and 15.

(Second Embodiment))

In the first embodiment, the resistances of the variable resistors 14 and 15 are from 160Ω to 8 kΩ. In trimming, there is a difficulty to adjust it with only one variable resistor for each stage. In the second embodiment, two variable resistors are provided for each stage. That is, the structure of the second embodiment is substantially the same as that of the first embodiment. The difference is that variable resistors 14a and 14b replace the variable resistor 14 and variable resistors 15a and 15b replace the variable resistor 15.

Figure 3:
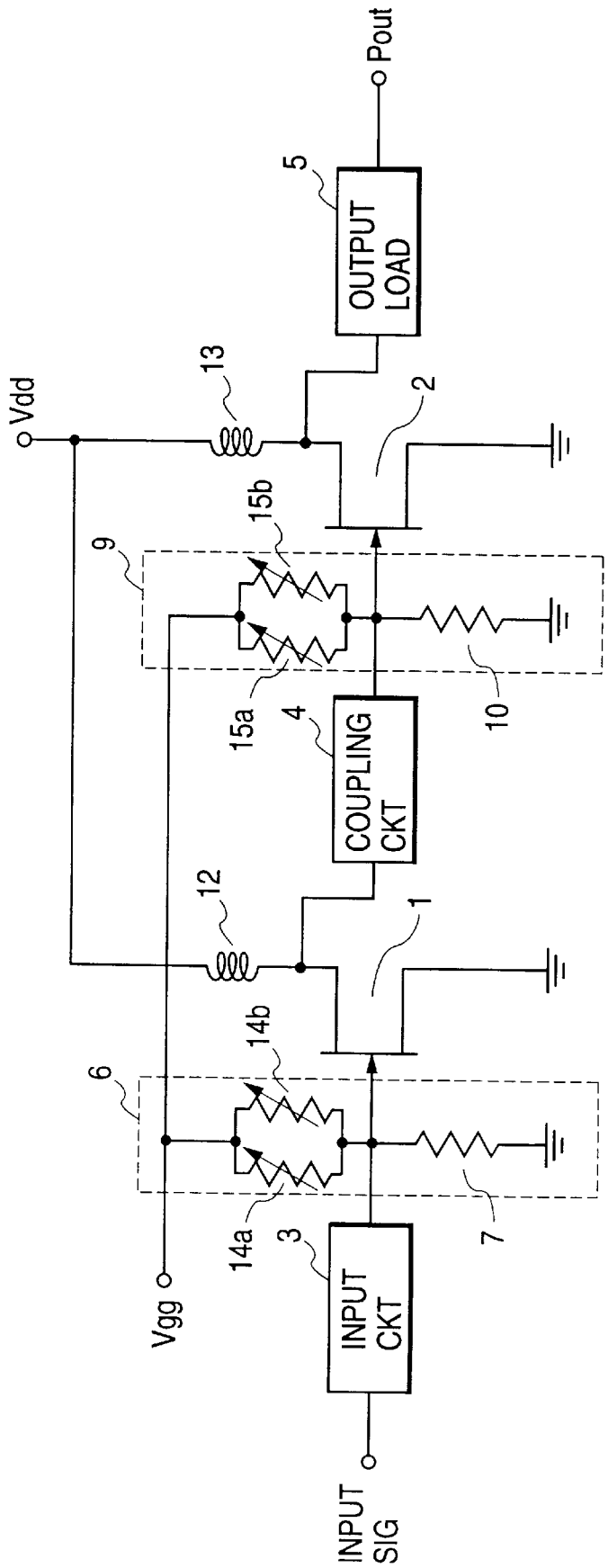
FIG. 3 is a circuit diagram of a power amplifier of a second embodiment.

FIG. 3 is a circuit diagram of a power amplifier of the second embodiment.

The variable resistors 14a and 14b are connected in parallel between the bias supply voltage Vgg and the gate of the FET 1 and variable resistors 15a and 15b are connected in parallel between the bias supply voltage Vgg and the gate of the FET 2.

Resistances of the variable resistors 14b and 15b are from 2 to 8 kΩ. The variable resistors 14a and 15a have resistances lower than 160Ω and the resistances are made substantially infinite by cutting it. For example, a resistor having 0Ω is cut by a laser.

Figure 4:
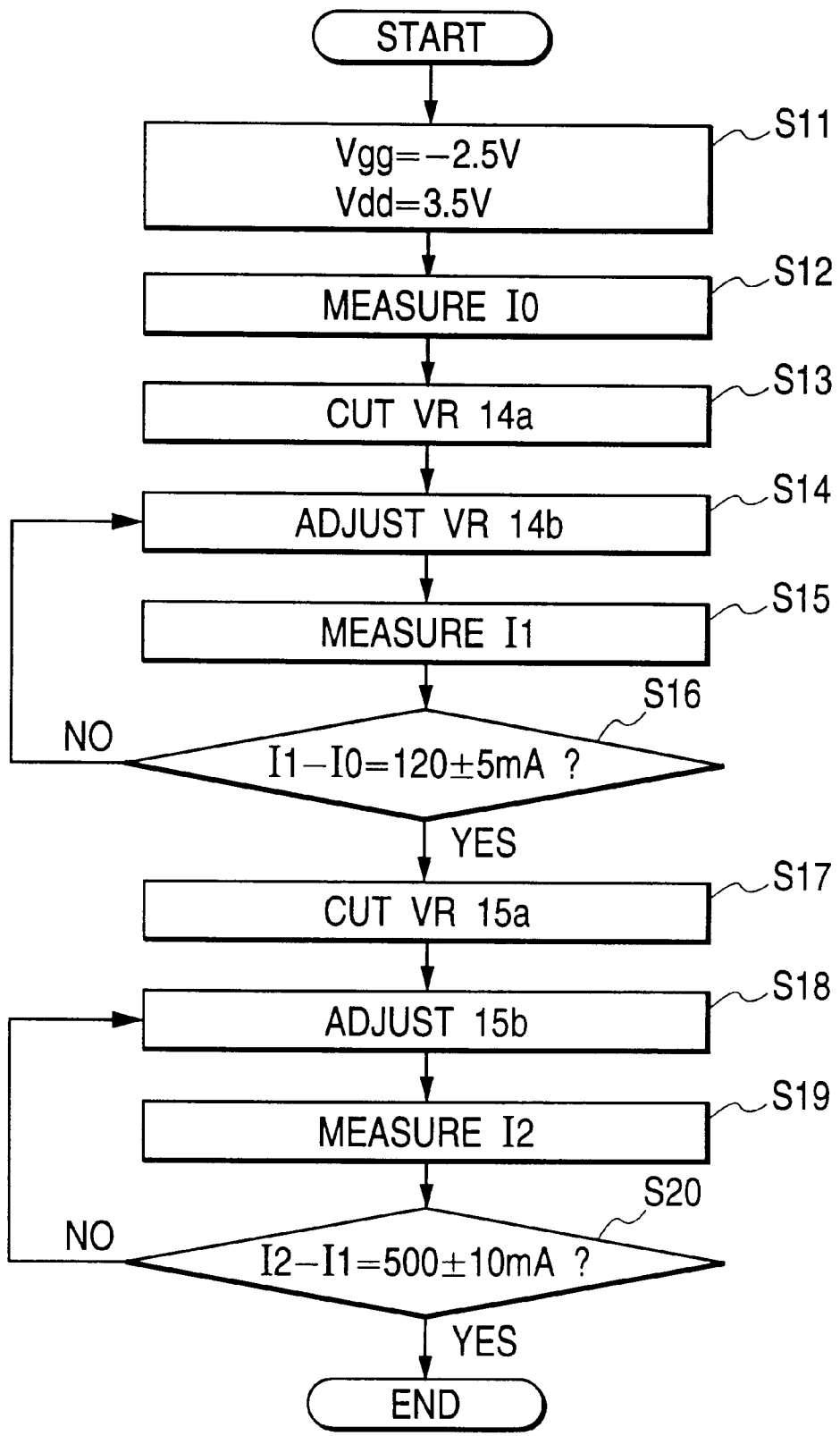
FIG. 4 shows a flow chart of the second embodiment showing trimming the variable resistors shown in FIG. 3.

FIG. 4 shows a flow chart of the second embodiment showing trimming the variable resistor 14b and 15b shown in FIG. 3.

In step s11, the supply voltages Vgg=−2.5 V and Vdd= 3.5V are applied to the power amplifier in this order. In the following step s12, an initial current I0 from the bias supply voltage Vdd is measured. In this condition the FETs 1 and 2 are in the pinch-off conditions, so that the initial current I0 is a total current other than drain currents in the FETs 1 and 2. In the following step s13, the variable resistor 14a is cut or insulated.

In the following steps s14 and s15, as the current I1 is measured, a resistance of the variable resistor 14b is varied. Then, the current I1 is a sum of the initial current I0 and the drain current of the FET 1. In step s16, a first difference I1−I0, that is, the drain current of the FET 1, is calculated and if the drain current of the FET 1 is within the first predetermined value, that is, 120±5 mA, trimming the variable resistor 14b has completed in step s16.

Moreover, in step s17, the variable resistor 15a is cut or insulated. In the following steps s18 and s19, as the current I2 from bias supply voltage Vdd after completion of trimming the variable resistor 14b is measured, the variable resistor 15b for the FET 2 in the rear stage is trimmed. Then, a second difference I2−I1, that is, the drain current in the FET 2 is calculated and if the drain current in the FET 2 is within the second predetermined value, that is, 500±10 mA, trimming the variable resistor 15b has completed in step s20.

As mentioned, the variable resistor 14b and 15b can be easily trimmed by providing the variable resistor 14a and 15a to provide the pinch-off condition and non-pinch-off condition surely.

In this embodiment, each of the variable resistors 14b and 15b may include a series circuit of a resistor and a variable resistor.

In this embodiment, the variable resistors 14a and 15a have resistances lower than 160Ω and can be perfectly insulated. However, it is also possible that the resistances of the variable resistors 14a and 15a are made sufficiently higher than the resistances of the variable resistors 14b and 15b.

Figure 5:
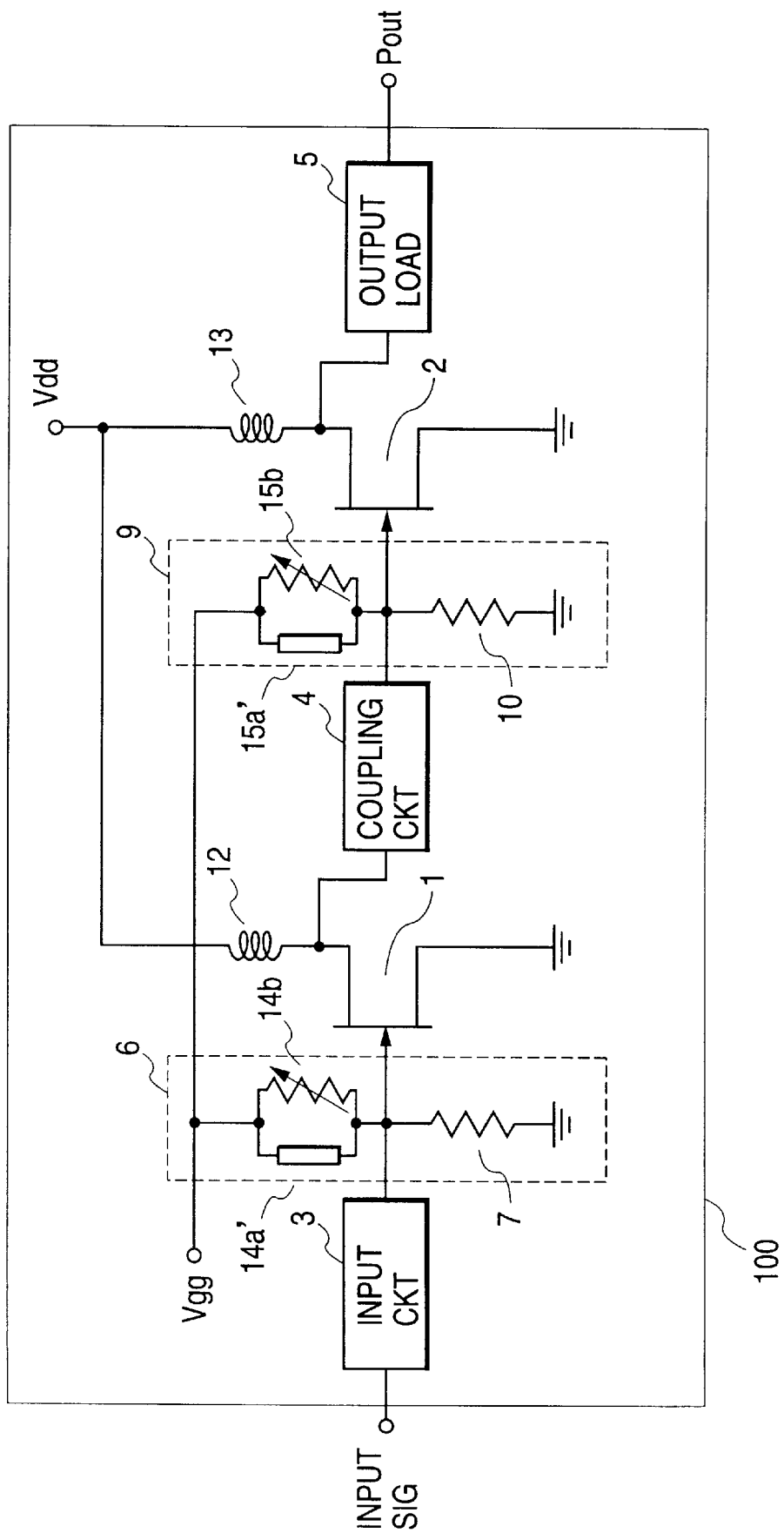
FIG. 5 is a circuit diagram of a power amplifier of a modification.

FIG. 5 is a circuit diagram of a power amplifier of a modification.

In this modification, variable resistors 14a' and 15a' are provided by circuit patterns on a printed circuit board 100 showing 0Ω at the initial condition and an infinite resistance after cutting the printed circuit patterns instead the variable resistors 14a and 15a.

(Third Embodiment)

Figure 6:
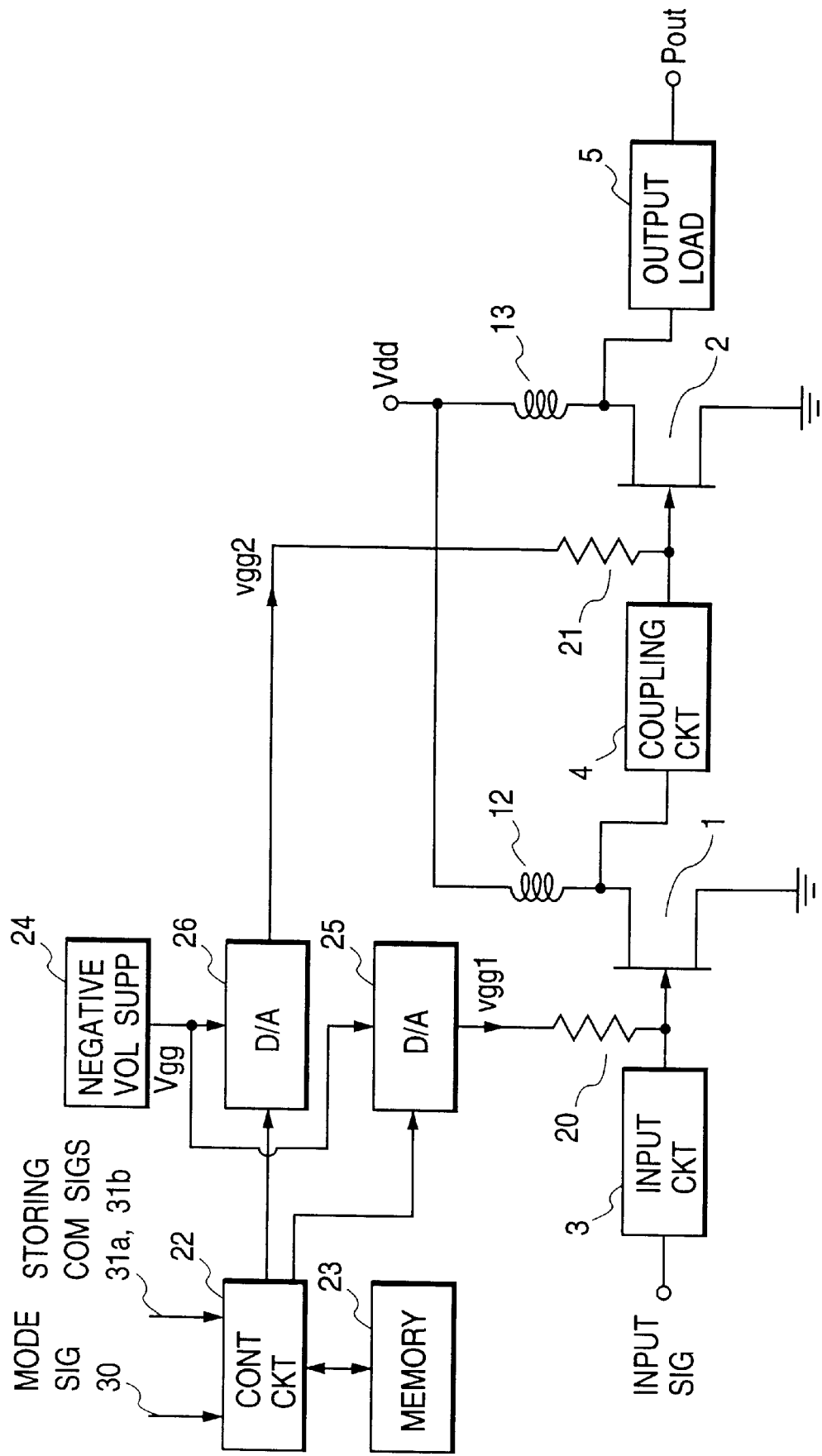
FIG. 6 is a circuit diagram of a power amplifier of a third embodiment.

FIG. 6 is a circuit diagram of a power amplifier of a third embodiment. The power amplifier of the third embodiment has substantially the same structure as the first embodiment. The difference is that the bias supply voltage Vgg is supplied from a negative voltage supply 24 to the gate of the FET 1 through a D/A converter 25 and a resistor 20 and to the gate of the FET 2 through a D/A converter 26 and a resistor 21 and further a control circuit 22 and a memory such as an EEPROM for supplying data to the D/A converters 25 and 26 are provided.

The control circuit 22 stores data in the memory 23 in response to a mode signal 30 and storing command signals 31a and 31b and reads and supplies data from the memory 23 in response to the mode signal 30.

When the mode signal 30 indicates a first mode, the control circuit 22 reads and supplies data for pinch-off from the memory to the D/A converters 25 and 26 to make the FETs 1 and 2 in the pinch-off conditions, that is, a bias supply voltage Vgg1=−2.5 V is supplied to the gate of the FET 1, a bias supply voltage Vgg2=−2.5 V is supplied to the gate of the FET 2, and the supply voltage Vdd=3.5 is supplied.

When the mode signal 30 indicates a second mode, the control circuit 22 reads and supplies data to the D/A converter 25 such that the drain current of the FET 1 successively increases. When the mode signal 30 indicates a third mode and a storing command signal 31a is supplied, the control circuit 22 stores the data presently supplied to the D/A converter 25 as first setting data in the memory 23.

When the mode signal 30 indicates a fourth mode, the control circuit 22 reads and supplies the setting data to the D/A converter 25.

Similarly, when the mode signal 30 indicates a fifth mode, the control circuit 22 reads and supplies data to the D/A converter 26 such that the drain current of the FET 2 successively increases. When the mode signal 30 indicates a sixth mode and a second storing command signal 31b, the control circuit 22 stores the data presently supplied to the D/A converter 26 as second setting data. When the mode signal 30 indicates a seventh mode, the control circuit 22 reads and supplies the second setting data from the memory 23 to the D/A converter 26. In fifth to seventh modes, the control circuit 22 holds the first setting data to the D/A converter 25 and in second to fourth modes the control circuit 22 holds the data for the pinch-off to the D/A converter 26.

Figure 7:
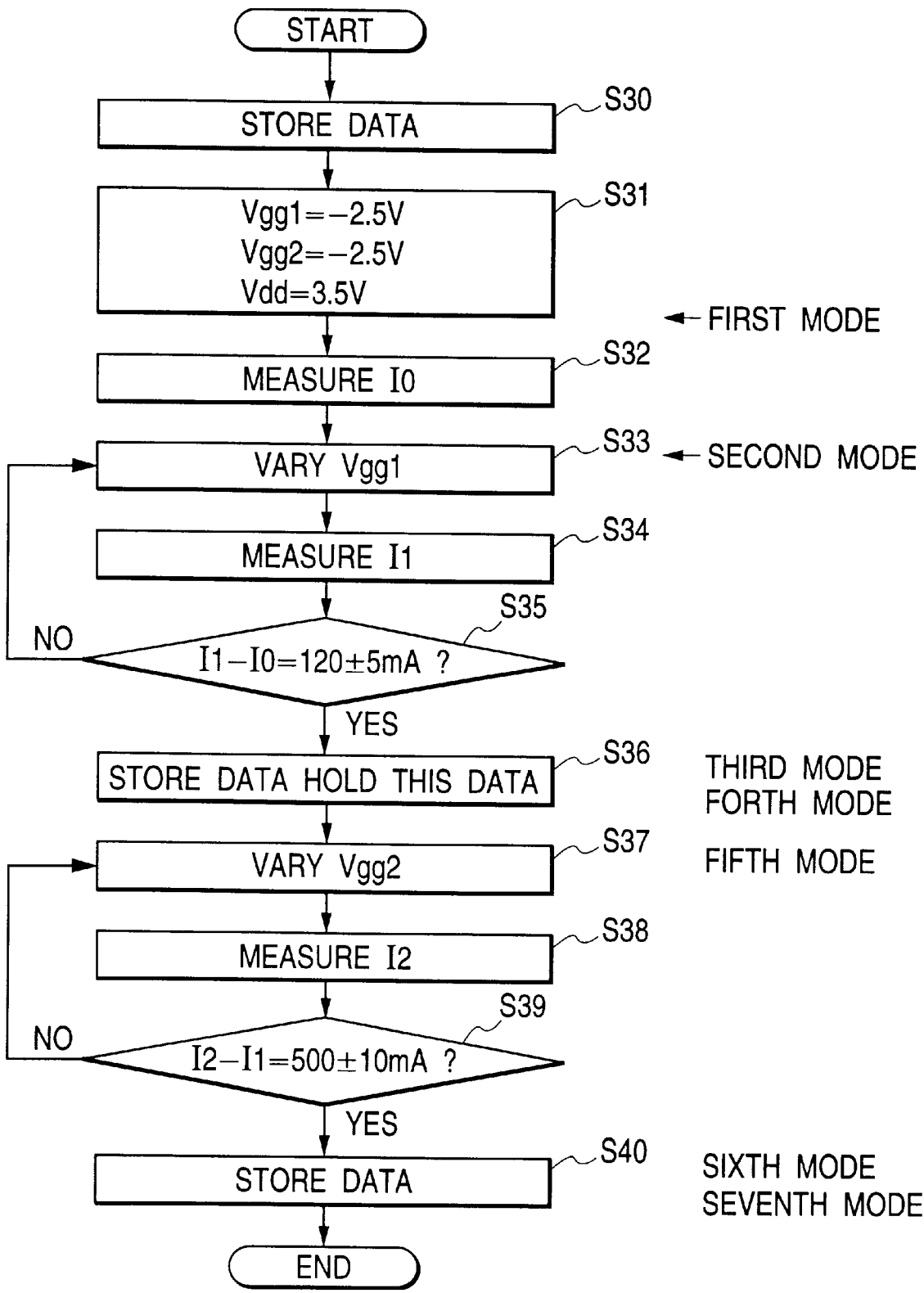
FIG. 7 shows a flow chart of the third embodiment showing trimming the drain currents to the FETs 1 and 2 shown in FIG. 6.
Figure 8:
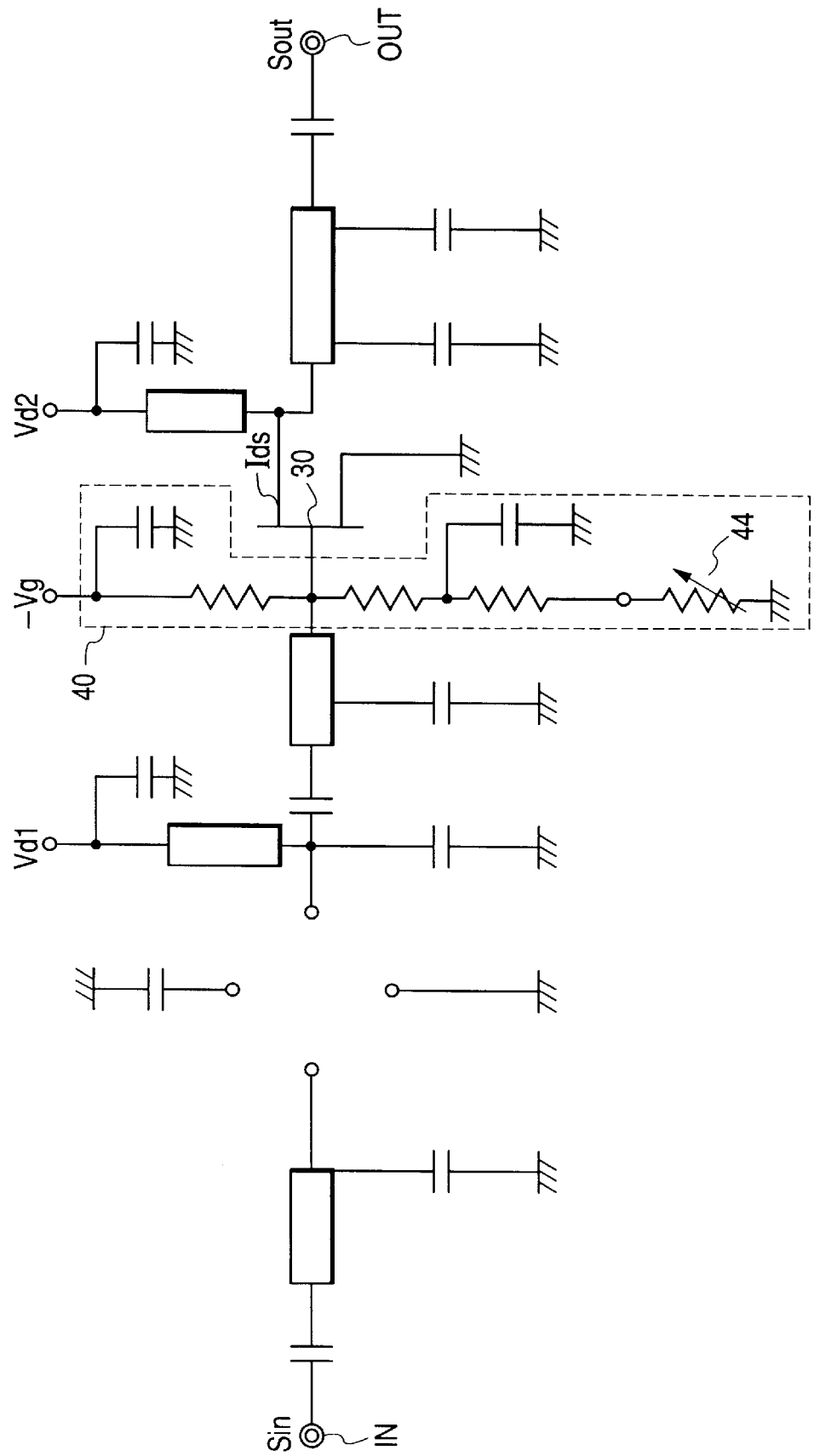
FIG. 8 is a circuit diagram of a prior art power amplifier.
Figure 9:
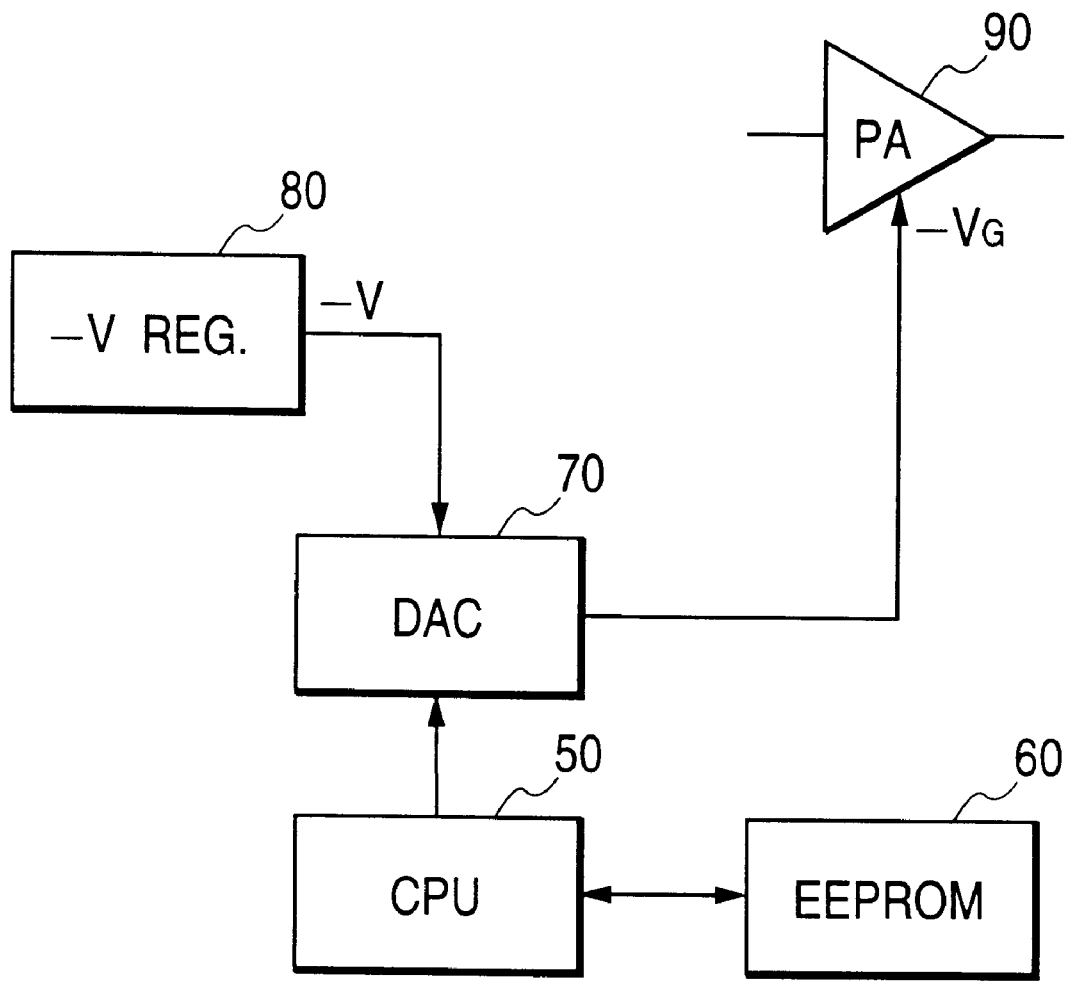
FIG. 9 is a block diagram of another prior art power amplifier including a gate bias voltage generation circuit.

FIG. 7 shows a flow chart of the third embodiment showing trimming the drain currents to the FETs 1 and 2 shown in FIG. 6.

In step s30, data for the pinch-off conditions, data for increasing the drain current of the FET 1, data for increasing the drain current of the FET 2 are stored.

In step s31, the bias supply voltages Vgg1=−2.5 V, the supply voltages Vgg2=−2.5 V and Vdd=3.5 V are applied to the power amplifier in this order. In the following step s32, an initial current I0 from the supply voltage Vdd is measured. In this condition the FETs 1 and 2 are in the pinch-off conditions, so that the initial current I0 is a total current other than drain currents in the FETs 1 and 2. In the following step s33, the control circuit 22 reads and supplies data for varying the bias supply voltage Vgg1 in the second mode.

In the following steps s33 and s34, as the current I1 is measured, the bias supply voltage Vgg1 is varied. Then, the current I1 is a sum of the initial current I0 and the drain current of the FET 1. In step s35, a difference I1−I0, that is, the drain current of the FET 1, is calculated and if the drain current of the FET 1 is within the first predetermined value, that is, 120±5 mA, the control circuit 22 stores the data presently supplied to the D/A converter 25 in the memory 23 in step s36 in response to the storing command signal 31a in the third mode and the control circuit 22 holds this data in the fourth mode and then, trimming the supply voltage Vgg1 has completed.

Moreover, in the following steps s37 and s38, as the current I2 from supply voltage Vgg1 after completion of trimming the current is measured, the supply voltage Vgg2 is trimmed in the fifth mode. Then, a second difference I2−I1, that is, the drain current in the FET 2 is calculated and if the drain current in the FET 2 is within the second predetermined value, that is, 500±10 mA, the control circuit 22 stores the data presently supplied to the D/A converter 26 in the memory 23 in step s40 in response to the storing command signal 31b in sixth mode and trimming the supply voltage Vgg2 has completed in step s40. In a seventh mode, the control circuit 22 supplies the first and second setting data to the D/A converters 25 and 26 respectively to operate the power amplifier to amplify the input signal and output the amplified signal.

In this embodiment, in step s36 and s40 the control circuit 22 stores the data supplied to the D/A converters 25 and 26. However, it is also possible to store addresses of the data supplied to the D/A converters 25 and 26 at those timings.

In the embodiment mentioned above, if there is multi-stage of FETs, the difference indicating the drain current under trimmed is obtained from the difference between the current from the bias supply voltage measured in the stage presently trimmed and the current measured in the stage Just previously trimmed.

In the embodiments mentioned above, the number of stages of FETs is two. However, this invention is applicable to the power amplifier having one stage of FET and to the power amplifier having more than two stages of FETs.

What is claimed is:

1. A power amplifier comprising:
   input means for receiving a signal;
   a bias voltage generation circuit, including a variable resistor, for generating a bias voltage;
   a field effect transistor, having a gate supplied with said received signal and said bias voltage, a source, and a drain, for amplifying the received signal;
   a source and drain circuit, coupled to said field effect transistor, for flowing a current through said source and said drain; and
   outputting means for outputting the amplified signal from said filed effect transistor, wherein said bias voltage generation circuit generates said bias voltage within a voltage range including a first voltage making said field effect transistor in a pinch-off condition, and can thereafter be adjusted to produce a second voltage making said field effect transistor in a non-pinch-off condition representing a predetermined source drain current condition for said field effect transistor.

2. The power amplifier as claimed in claim 1, wherein said bias voltage generation circuit comprises a second variable resistor connected to said variable resistor in parallel, a resistance of said second variable resistor having a resistance range including a resistance making said field effect transistor in said pinch-off condition.

3. The power amplifier as claimed in claim 2, further comprises a printed circuit board, wherein said second variable resistor comprises a printed circuit pattern on said printed circuit board to provide said pinch-off condition and said printed circuit pattern is provided to be cut to provide said non-pinch-off condition.

4. A power amplifier comprising: input means for receiving a signal;
   a bias voltage generation circuit including storing and reading means responsive to a mode signal indicative of first to fourth modes and a storing command signal and voltage generation means, said storing and reading means storing a pinch-off voltage data, storing successively varying data set, for storing one data of said successively varying data set in response to said storing command signal in said first mode, and for reading said pinch-off voltage in said second mode, successively reading said successively varying data set in said third mode, and said one data of said successively varying data set stored in response to said store command signal in said fourth mode, said voltage generation means generating a bias voltage in accordance with an output of said storing and reading means;
   a field effect transistor, having a gate supplied with said received signal and said bias voltage, a source, and a drain, for amplifying the received signal in said fourth mode;
   a source and drain circuit, coupled to said field effect transistor, for flowing a current through said source and said drain; and
   outputting means for outputting the amplified signal from said field effect transistor.

5. A power amplifier comprising:
   input means for receiving a signal;

a bias voltage generation circuit including storing and reading means responsive to a mode signal indicative of first to fourth modes and a storing command signal and voltage generation means, said storing and reading means storing a pinch-off voltage data, storing successively varying data set, for storing an address of one data of said successively varying data set in response to said storing command signal in said first mode, and for reading said pinch-off voltage in said second mode, successively reading said successively varying data set in said third mode, and said one data of said successively varying data set using said address stored in response to said store command signal in said fourth mode, said voltage generation means generating a bias voltage in accordance with an output of said storing and reading means;

a field effect transistor, having a gate supplied with said received signal and said bias voltage, said pinch-off voltage making said field effect transistor in a pinch-off condition a source, and a drain, for amplifying the received signal in said fourth mode;

a source and drain circuit, coupled to said field effect transistor, for flowing a current through said source and said drain; and outputting means for outputting the amplified signal from said field effect transistor.

6. A method of trimming a power amplifier including a field effect transistor and a bias voltage supply, comprising the steps of:

(a) providing a variable resistor supplying a bias voltage to a gate of said field effect transistor from said bias voltage supply;

(b) trimming said variable resistor to make said bias voltage to a pinch-off voltage of said field effect transistor;

(c) measuring a first current from said bias voltage supply in step (b);

(d) adjusting said variable resistor;

(e) measuring a second current from said bias voltage supply in step (d);

(f) calculating a difference between said first and second currents; and (g) determining a resistance of said variable resistor to make said difference within a predetermined value to amplify an input signal.

7. A method of trimming a power amplifier including a field effect transistor and a bias voltage supply, comprising the steps of:

(a) providing a first variable resistor supplying a bias voltage to a gate of said field effect transistor from said bias voltage supply;

(b) providing a second variable resistor connected to said variable resistor in parallel in a condition that said first and second variable resistors provide a pinch-off voltage to said field effect transistor;

(c) measuring a first current from said bias voltage supply;

(d) making a resistance of said second variable resistor considerably higher than a resistance of said first resistor;

(e) measuring a second current from said bias voltage supply after step (d);

(f) adjusting said first variable resistor;

(g) calculating a difference between said first and second currents; and (h) determining said resistance of said first variable resistor to make said difference within a predetermined value to amplify an input signal.

8. The method as claimed in claim 7, wherein said second variable resistor is provided on a printed circuit board in step (b) and said second variable resistor is cut in step (d).

9. A method of trimming a power amplifier including a field effect transistor and a bias voltage supply, comprising the steps of:

(a) providing a memory and a d/a converter to said power amplifier circuit;

(b) storing data first data for a pinch-off voltage and data set for successively varying gate bias voltage;

(c) supplying said pinch-off voltage to a gate of said field effect transistor using said data from said memory, said d/a converter, and said bias voltage supply;

(d) measuring a first current from said bias voltage supply;

(e) supplying said bias voltage to said gate of said field effect transistor with said bias voltage successively varied using said successively varying gate bias voltage from said memory, said d/a converter, and said bias voltage supply;

(f) measuring a second current from said bias voltage supply in step (e);

(g) calculating a difference between said first and second currents; and (h) determining final data in accordance with the calculated difference to make said difference within a predetermined value;

(i) storing said final data in said memory; and (j) supplying a final bias voltage to said gate of said field effect transistor in accordance with said stored final data to amplify an input signal.

10. A method of trimming a power amplifier including multi-stage field effect transistors cascaded and a bias voltage supply, comprising the steps of:

(a) providing variable resistors for supplying bias voltages to gates of said multi-stage field effect transistors from said bias voltage supply;

(b) trimming said variable resistors to make said multi-stage field effect transistors in pinch-off conditions;

(c) measuring a first current from said bias voltage supply in said pinch-off conditions;

(d) adjusting one of said viable resistance of one of said multi-stage field effect transistors;

(e) measuring a second current from said bias voltage supply in step (d);

(f) calculating a difference between said first and second currents; and (g) determining a resistance of said variable resistor to make said difference within each of predetermined values, wherein said steps (d) to (h) are repeatedly performed to the other stages of said multi-stage of field effect transistors in order from said one of said multi-stage field effect transistors of which one of said predetermined values is smallest, said difference in step (f) being made between said second current presently measured in step (e) and said second current just previously measured in step (e) in the other stages of said multi-stage of field effect transistors.

* * * * *